United States Patent
Booth, Jr. et al.

(10) Patent No.: US 7,417,300 B2
(45) Date of Patent: Aug. 26, 2008

(54) ELECTRICALLY PROGRAMMABLE FUSE STRUCTURES WITH NARROWED WIDTH REGIONS CONFIGURED TO ENHANCE CURRENT CROWDING AND METHODS OF FABRICATION THEREOF

(75) Inventors: Roger A. Booth, Jr., Rochester, MN (US); Jack A. Mandelman, Flat Rock, NC (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 11/372,386

(22) Filed: Mar. 9, 2006

(65) Prior Publication Data

US 2007/0210413 A1   Sep. 13, 2007

(51) Int. Cl.
*H01L 29/00* (2006.01)
(52) U.S. Cl. .................................. 257/529; 257/528
(58) Field of Classification Search .................. 257/529
See application file for complete search history.

(56) References Cited

U.S. PATENT DOCUMENTS

| | | | |
|---|---|---|---|
| 4,382,289 A | 5/1983 | Saitoh | |
| 4,536,948 A | 8/1985 | Te Velde et al. | 29/577 |
| 4,670,970 A | 6/1987 | Bajor | |
| 4,747,076 A | 5/1988 | Mukai | |
| 5,019,532 A | 5/1991 | Kaya | |
| 5,420,456 A | 5/1995 | Galbi et al. | |
| 5,572,409 A | 11/1996 | Nathan et al. | |
| 6,271,574 B1 * | 8/2001 | Delpech et al. | 257/529 |
| 6,337,507 B1 | 1/2002 | Bohr et al. | 257/529 |
| 6,512,284 B2 | 1/2003 | Schulte et al. | |
| 6,642,601 B2 | 11/2003 | Marshall et al. | 257/529 |
| 6,661,330 B1 | 12/2003 | Young | 337/297 |
| 6,756,255 B1 | 6/2004 | Thuruthiyil et al. | 438/132 |
| 6,879,018 B2 | 4/2005 | Marr et al. | 257/529 |
| 6,960,978 B2 | 11/2005 | Leigh et al. | |
| 2002/0074618 A1* | 6/2002 | Marshall et al. | 257/529 |

(Continued)

FOREIGN PATENT DOCUMENTS

JP   60231350 A   11/1985

(Continued)

*Primary Examiner*—Son Dinh
*Assistant Examiner*—Allison P Bernstein
(74) *Attorney, Agent, or Firm*—Heslin Rothenberg Farley & Mesiti PC

(57) ABSTRACT

Electrically programmable fuse structures and methods of fabrication thereof are presented, wherein a fuse includes first and second terminal portions interconnected by an elongate fuse element. The first terminal portion has a maximum width greater than a maximum width of the fuse element, and the fuse includes a narrowed width region where the first terminal portion and fuse element interface. The narrowed width region extends at least partially into and includes part of the first terminal portion. The width of the first terminal portion in the narrowed region is less than the maximum width of the first terminal portion to enhance current crowding therein. In another implementation, the fuse element includes a restricted width region wherein width of the fuse element is less than the maximum width thereof to enhance current crowding therein, and length of the restricted width region is less than a total length of the fuse element.

9 Claims, 6 Drawing Sheets

U.S. PATENT DOCUMENTS

| | | |
|---|---|---|
| 2003/0209734 A1 | 11/2003 | Kothandaraman |
| 2004/0209404 A1 | 10/2004 | Wang et al. .................. 438/132 |
| 2005/0189613 A1* | 9/2005 | Otsuka et al. ............... 257/529 |
| 2005/0219932 A1 | 10/2005 | Diorio et al. |

FOREIGN PATENT DOCUMENTS

| | | |
|---|---|---|
| JP | 63246844 A | 10/1988 |
| JP | 05120985 A | 5/1993 |

* cited by examiner

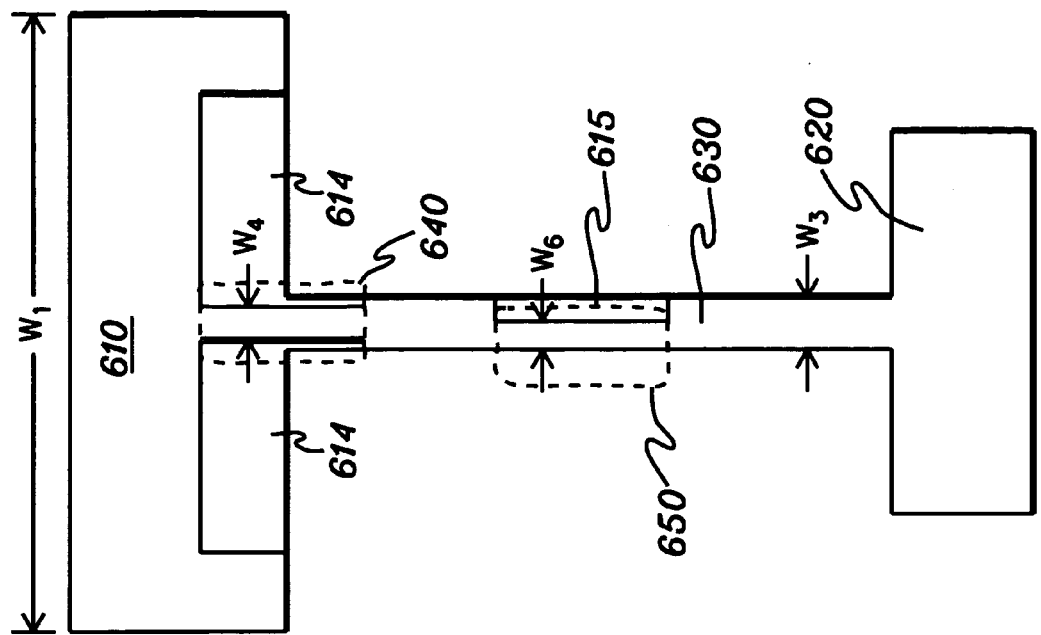
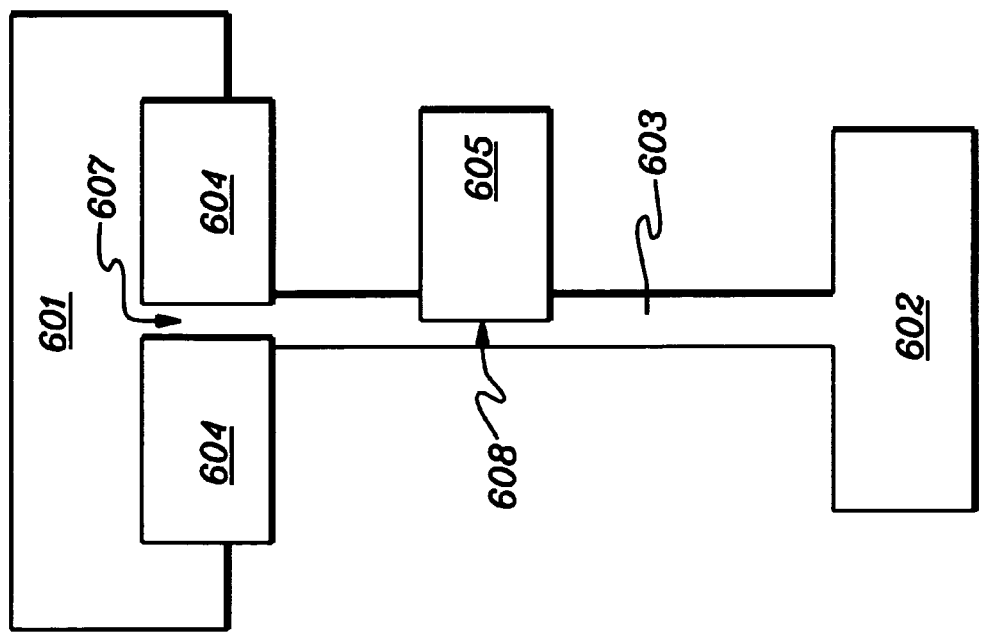

ELECTRICALLY PROGRAMMABLE FUSE STRUCTURES WITH NARROWED WIDTH REGIONS CONFIGURED TO ENHANCE CURRENT CROWDING AND METHODS OF FABRICATION THEREOF

CROSS-REFERENCE TO RELATED APPLICATIONS

This application contains subject matter which is related to the subject matter of the following co-filed, commonly assigned applications, each of which is hereby incorporated herein by reference in its entirety:

"Electrically Programmable Fuse Structures with Terminal Portions Residing at Different Heights, and Methods of Fabrication Thereof", by Booth et al., U.S. Ser. No. 11/372,334, filed Mar. 9, 2006;

"Electronic Fuse with Conformal Fuse Element Formed Over a Freestanding Dielectric Spacer", by Hsu et al., U.S. Ser. No. 11,372,387, filed Mar. 9, 2006; and "Electrically Programmable π-Shaped Fuse Structures and Methods of Fabrication Thereof", by Booth et at., U.S. Ser. No. 372,380, filed Mar. 9, 2006.

TECHNICAL FIELD

The present invention relates in general to semiconductor structures and methods of fabrication thereof, and more particularly, to fuses and methods of fabrication thereof, which employ a fuse element that is electrically programmable utilizing today's integrated circuit operating voltages.

BACKGROUND OF THE INVENTION

Historically, repair of dynamic random access memory (DRAM) arrays is achieved by replacing defective word-lines or bit-lines with redundant word-lines or bit-lines, using a laser to open circuit fuses made of a conductive material. As devices continue to shrink, the relative size of these laser fuses is limited by the wavelength of the laser employed. Therefore, the size of the laser fuse cannot be shrunk indefinitely. Thus, ablative laser-blown fuses become more difficult to implement due to the silicon space required to implement the fuses and avoid damage to neighboring circuits. Further, repairing an integrated circuit chip by open circuiting thousands of laser programmable fuses is a time consuming process.

An alternative fuse approach is to implement an electrically programmable fuse. One-time electrically programmable fuses, referred to as e-fuses, have become popular recently due to the circuit and system design flexibility which they provide. For example, an e-fuse can be programmed even after the integrated circuit chip has been packaged and installed in the system (unlike the laser fuse approach). For instance, a customer can tailor a circuit design to the specific needs of the application after the circuit is installed in the field. An e-fuse also provides freedom to alter a circuit design, or fix a problem that may occur during the life of the product. Electrically programmable fuses are much smaller than ablative-type fuses, resulting in circuit density advantages. Although electrically programmable e-fuses provide these noted benefits, integration with standard CMOS processing has been problematic. Furthermore, obtaining a tight distribution of open circuiting voltages derived using today's normal operating voltages continues to be challenging. Existing e-fuses today typically require voltages in excess of normal supply voltages for programming. As operating voltages continue to be aggressively scaled down with each succeeding generation of integrated circuit technology, obtaining sufficiently high voltages for programming an e-fuse can tax the electrical operating limits of the technology, and increase circuit complexity, for example, due to the need for charge pumps.

In view of this, there remains a need in the art for enhanced electrically programmable fuses, and methods of fabrication thereof, which may be readily programmed with today's on-chip operating voltages, and be readily integrated with standard semiconductor circuit fabrication processing.

SUMMARY OF THE INVENTION

Briefly summarized, the present invention comprises in one aspect an electrically programmable fuse for an integrated circuit. The fuse includes a first terminal portion and a second terminal portion interconnected by an elongate fuse element. The first terminal portion has a maximum width greater than the maximum width of the elongate fuse element, and the fuse includes a narrowed width region where the first terminal portion and the elongate fuse element interface. The narrowed width region extends at least partially into and comprises part of the first terminal portion, and a width of the first terminal portion in the narrowed width region is less than the maximum width of the first terminal portion to enhance current crowding therein.

In another aspect, an electrically programmable fuse for an integrated circuit is provided which includes a first terminal portion and a second terminal portion interconnected by an elongate fuse element. In this embodiment, the elongate fuse element has a maximum width and includes a restricted width region where width of the elongate fuse element is less than the maximum width of the elongate fuse element to enhance current crowding therein, and a length of the restricted width region is less than a total length of the elongate fuse element.

In a further aspect, a method of fabricating an electrically programmable fuse for an integrated circuit is provided. The method includes: forming a fuse on a support structure, the fuse comprising a first terminal portion and a second terminal portion interconnected by an elongate fuse element; and wherein the first terminal portion has a maximum width greater than a maximum width of the elongate fuse element, and the fuse includes a narrowed width region where the first terminal portion and elongate fuse element interface, the narrowed width region extending at least partially into and comprising part of the first terminal portion, and wherein a width of the first terminal portion in the narrowed width region is less than the maximum width of the first terminal portion to enhance current crowding therein.

In a yet further aspect, a method of fabricating an electrically programmable fuse for an integrated circuit is provided. This method includes: forming a fuse on a support structure, the fuse comprising a first terminal portion and a second terminal portion interconnected by an elongate fuse element; and wherein the elongate fuse element has a maximum width and includes a restricted width region wherein width of the elongate fuse element within the restricted width region is less than the maximum width of the elongate fuse element to enhance current crowding therein, and a length of the restricted width region is less than a total length of the elongate fuse element.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6 is still another plan view layout of a polysilicon support structure, and showing blocking masks defining multiple regions of exposed, reduced width polysilicon, to be employed in a fuse fabrication approach, in accordance with an aspect of the present invention;

FIG. 6A is a plan view of one embodiment of a resultant fuse formed by siliciding the polysilicon support structure of FIG. 6, in accordance with an aspect of the present invention;

BEST MODE FOR CARRYING OUT THE INVENTION

Typically, the resistance of programmed prior art polycide e-fuses is highly variable. Large variations in the electrical characteristics of the driver transistors due to threshold voltage (Vt) variations are commonly encountered. This results in variations in programming current, which in turn causes the length of the opened gap (electromigration length of the silicide) in the fuse element to vary. Since read current is traditionally forced through the silicon underlying the blown fuse element, the overall resistance of the programmed fuse will also vary. This dependence of the programmed resistance on the electromigration length of the silicide can lead to difficulties in correctly sensing the state of a programmed e-fuse.

In addition, recently developed e-fuse structures take advantage of electromigration (EM) effects to address certain of the above-noted problems of achieving scaling of programming voltage. Briefly, the EM effect, caused by a positive divergence of electron flux, leads to an accumulation of vacancies, forming voids in the metal. Voids are formed inside of the metal conductors due to metal ion movement caused by momentum transfer from the electron flux at high current density. The void growth rate is a function of current density, and therefore, the site having the smallest cross-sectional area in an interconnect tends to form voids first. Thus, it is advantageous to somehow increase the local current density in the fuse element.

Figure 1:
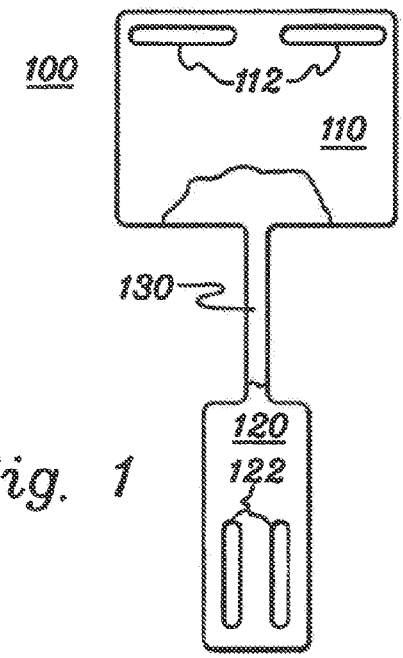
FIG. 1 is a plan view of one embodiment of a planar, "dog-bone" shaped electrically programmable fuse.

One approach to increasing local current density is depicted in FIG. 1, wherein the plan view layout of the illustrated electronic fuse 100 is a two-dimensional "dog-bone" shape. Fuse 100, which employs in-plane dimensional differences to locate an open circuit site via a localized high electron/current flow, includes a large cathode pad 110 (having electrical contacts 112 thereto) and a large anode pad 120 (having electrical contacts 122 thereto), between which a small cross-section interconnect 130 is disposed. This configuration has been adopted in the semiconductor industry as a basic e-fuse design. Although this e-fuse design alleviates some of the above-noted problems of scaling, size and programming energy requirements, there is still a need for further progress in these areas to meet requirements below the 65 nm technology level.

Figure 2:
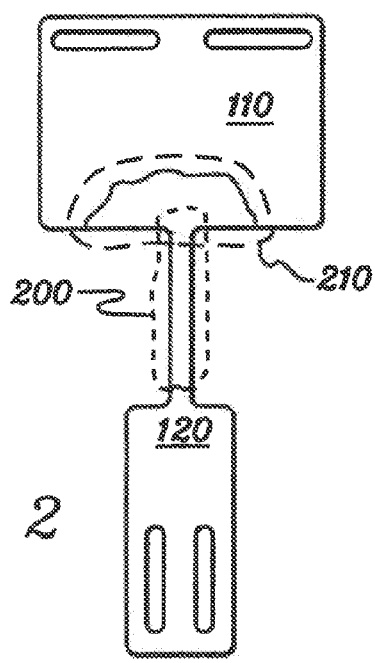
FIG. 2 is a plan view of the fuse embodiment of FIG. 1 after open circuiting thereof, and illustrating conductor electromigration from the first terminal portion.

FIG. 2 illustrates certain undesirable electromigration effects which can occur in the cathode pad region 110 with open circuiting of fuse 100. Because the cathode pad tends to heat at the intersection of the pad with the fuse element, electromigration of conductive material from region 210 of cathode pad 110 to anode pad 120 has been discovered to occur during open circuiting of the fuse element in region 200. Region 210 is an undesirable electromigration region, while region 200 is the desired electromigration region. These regions occur because the cathode and fuse element are both heating due to the flux divergence, or current crowding, that takes place during programming of the fuse. Although this e-fuse design provides adequate programming (that is, when programmed, the electromigration of the top layer of metal is substantially complete in the fuse element), the energy required to program the e-fuse is large, due in part, to the unwanted expending of energy in the cathode electromigration. This effect limits scaling of the e-fuse to a lower programming energy. That is, although the energy required to electromigrate the fuse element decreases with lithographic scaling, the wasted energy expended in the cathode region remains relatively constant. Thus, energy scaling of the electronic fuse is not achieved. Observing the relative areas below the fuse, energy wasted in the cathode region is about 2-3 times that required to open circuit the fuse element.

Figure 3:
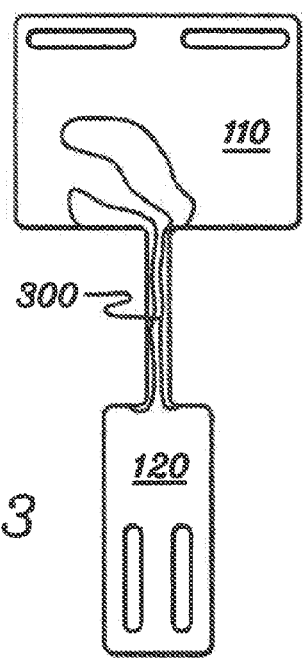
FIG. 3 is another plan view of the fuse embodiment of FIG. 1 after open circuiting thereof, and illustrating "healing" of an open circuited fuse by conductor electromigration from the first terminal portion, into the fuse element and to the second terminal portion.

FIG. 3 depicts another undesirable consequence of cathode region electromigration which can occur with open circuiting of the fuse. In this figure, cathode metal is re-deposited 300 throughout the fuse element, causing damage and re-growth (e.g., of silicide) in the fuse element. This resultant bridge through the fuse element causes an e-fuse programming failure, i.e., the e-fuse programmed resistance does not increase as expected with opening of the fuse. This imposes a large control and variation issue with cathode pad electromigration.

As one specific example, the e-fuse described herein is fabricated of silicide disposed on a polysilicon support structure. Silicide electromigration from a cathode pad to an anode pad can occur as a result of a direct force or a wind force. The direct action of the external field on the charge of the migrating ion is a direct force, while scattering of the conductor electrons by the metal atom under consideration is a wind force. The term "electronic wind force" refers to the net effect of these two electrical forces. The increase in the local current density between the cathode pad and the fuse element is referred to as "current crowding". Since joule heating is proportional to the square of current density, the current crowding effect leads to a local temperature rise around the silicide migration, which in turn further accelerates the migration, resulting (for example) in the undesirable electromigration illustrated in FIG. 2. The process continues until the void is large enough to break the fuse element, or alternatively, to completely migrate silicide from the polysilicon in the region of the fuse element. Note that the underlying polysilicon support structure remains a good conductor at joule heated temperatures of the fuse element, that is, at 1800°-2200° C.

At these temperatures, there are healing effects which can take place. Typically, these effects refer to those caused by the atomic flow in the direction opposite to the electron wind force, i.e., the back-flow, during or after electromigration. The effects in the electronic fuse can result in the "healing" illustrated in FIG. 3, where cathode pad electromigration has taken place. It is known that this back-flow of mass begins to take place once a redistribution of mass (i.e., upper conductor layer, e.g., silicide) has begun to form. It tends to reduce the failure rate during electromigration, and partially heals the damage after current is removed. The cause of this back-flow of mass is the inhomogenities, such as temperature and/or concentration gradients, resulting from electromigration damage. It is an object of the structures and methods disclosed herein to minimize this healing effect.

Generally stated, provided herein are electrically programmable fuse structures and methods of fabrication thereof which minimize the joule heating within the cathode at the cathode/fuse element interface by altering the flux divergence within the cathode itself. This is achieved, in one embodiment, by altering the metal volume at the transition point and/or by interrupting the actual current within the cathode pad, thus imposing a non-uniform thermal gradient within the cathode, thereby slowing electromigration of the cathode metal. The improved electrically programmable fuse structures, and methods of fabrication thereof, described herein advantageously integrate well with standard processing, are scalable with technology levels, are compact and provide a degree of freedom wherein absolute programming power can be scaled with existing integrated circuit supplied.

In various embodiments, the electrically programmable fuse structures presented below have a first terminal portion, a second terminal portion and a fuse element, which interconnects the first terminal portion and the second terminal portion. The first terminal portion has a maximum width greater than a maximum width of the elongate fuse element, and the fuse includes a specially configured, narrowed width region where the first terminal portion and the elongate fuse element interface. This narrowed width region extends at least partially into and comprises part of the first terminal portion. Width of the first terminal portion in the narrowed width region is less than the maximum width of the first terminal portion to enhance current crowding therein. As a specific example, the first terminal portion is the cathode pad, while the second terminal portion is the anode pad, and the fuse has an overall dog-bone shape in plan view, with the first terminal portion, the second terminal portion and the fuse element being coplanar, and having a common thickness (e.g., of silicide).

In an alternate configuration, the electrically programmable fuse presented herein has a first terminal portion, a second terminal portion and a fuse element, which interconnects the first terminal portion and the second terminal portion. The elongate fuse element has a maximum width and includes a restricted width region wherein width of the elongate fuse element within the restricted width region is less than the maximum width of the elongate fuse element to enhance current crowding therein, and a length of the restricted width region is less than a total length of the elongate fuse element.

Methods of fabricating various electrically programmable fuse structures are also presented. In the illustrated embodiments, it is assumed that there is a support structure with an overlying metal defining the fuse. As one example, the support structure is an underlying polysilicon support structure, and the conductor is silicide formed in exposed regions of the polysilicon support structure. Selected configuration of the polysilicon, or one or more blocking masks may be employed to define the various narrowed and restricted width regions disclosed herein. The phrase "narrowed width region" refers to a reduced width region of the fuse at the interface between the first terminal portion and the fuse element. In one embodiment, the narrowed width region comprises part of the first terminal portion. In another embodiment, the narrowed width region comprises part of both the first terminal portion and the fuse element. The term "restricted width region" refers to a region of the fuse element having a reduced width compared to the maximum width of the fuse element, thereby enhancing current crowding within the fuse element itself. In one embodiment, the restricted width region is disposed in a fuse element having a constant width outside of the restricted width region. This constant width is referred to herein as the maximum width of the elongate fuse element.

Figure 4A:
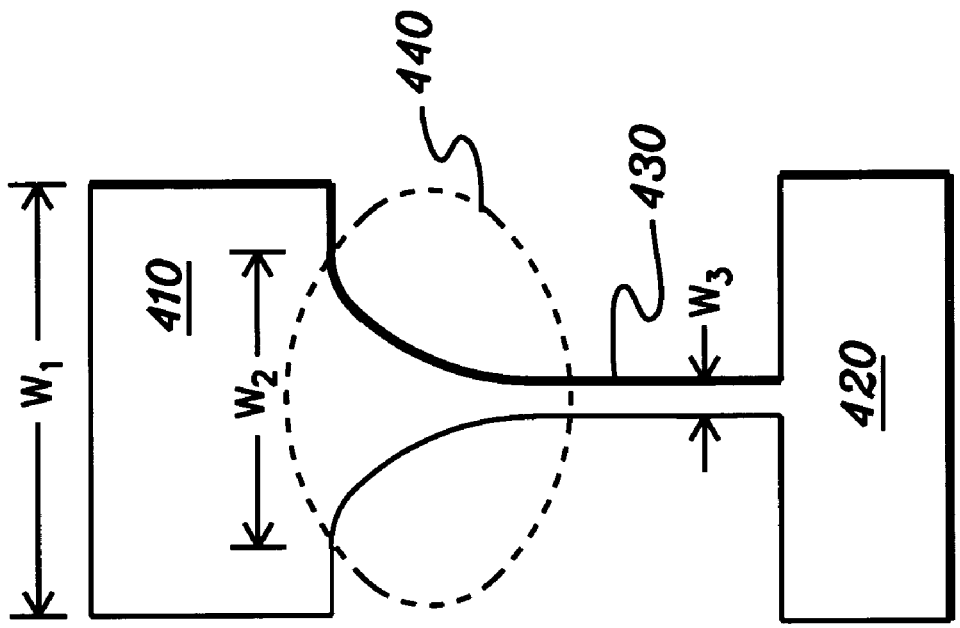
FIG. 4A is a plan view of one embodiment of a resultant fuse formed by siliciding the polysilicon support structure of FIG. 4, in accordance with an aspect of the present invention.
Figure 4:
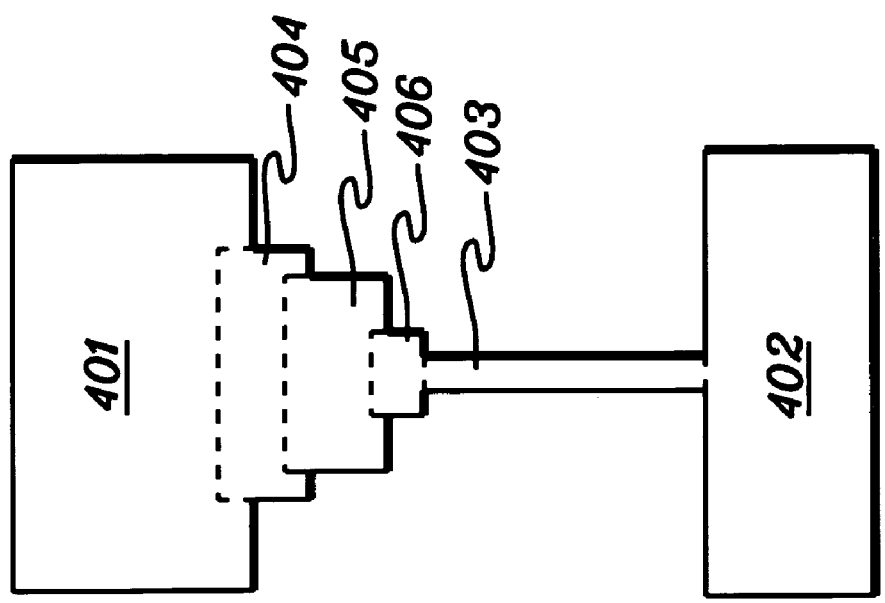
FIG. 4 is a plan view layout of a polysilicon support structure to be employed in a fuse fabrication approach, in accordance with an aspect of the present invention.

FIGS. 4 & 4A depict a first approach to fabricating a fuse structure, in accordance with an aspect of the present invention.

FIG. 4 illustrates one layout of a stepped polysilicon support structure, wherein multiple rectangles 401-406 of polysilicon are defined, e.g., above a supporting substrate (not shown). Regions 401 and 404-406 are polysilicon support structures for the first terminal portion to be formed, region 402 is a polysilicon support structure for the second terminal portion to be formed, while region 403 is an elongate polysilicon support structure over which the fuse element is to be formed. These rectangular structures can be readily formed using standard lithographic techniques.

FIG. 4A depicts one embodiment of the resultant printed fuse formed by siliciding of the exposed polysilicon layout of FIG. 4. As is well known, siliciding of polysilicon can be accomplished by deposition of nickel, cobalt, tungsten, titanium, tantalum, or other metal capable of reacting with silicon to form a low resistivity, thermally stable silicide. The intermediate structure is annealed to react the metal with the silicon and thereby form the silicide. As shown, the fuse includes a first terminal portion 410 and a second terminal portion 420 interconnected by an elongate fuse element 430. Elongate fuse element 430 has a constant width equal to a maximum width $W_3$ thereof. A narrowed width region 440 comprising a tapered region is defined at the interface of first terminal portion 410 and fuse element 430. In this embodiment, narrowed width region 440 tapers from a first width $W_2$, less than a maximum width $W_1$, to a second width $W_3$ of the fuse element. In accordance with the description presented herein, and by way of example only, the narrowed width region 440 is stated to comprise part of the first terminal portion 410. The purpose of the tapering is to enhance electromigration in a region of the fuse, i.e., the fuse element, spaced further from the bulk of the first terminal portion 410. This inhibits electromigration from the first terminal portion. Although described herein as comprising part of the first terminal portion, those skilled in the art will understand that the narrowed width region 440 could alternatively be characterized as comprising a diverging end of the fuse element at the interface between the fuse element and the first terminal portion. The appended claims are intended to cover either characterization.

Advantageously, the fuse of FIG. 4A results in reduced heating at the interface between the first terminal portion and the fuse element by altering flux divergence within the first terminal portion itself. This is accomplished by altering the metal (e.g., silicide) volume at the interface point between the first terminal portion and the fuse element. The result is a non-uniform thermal gradient within the first terminal portion which slows down the electromigration of metal from the first terminal portion with the application of current between the first and second terminal portions.

Figure 5A:
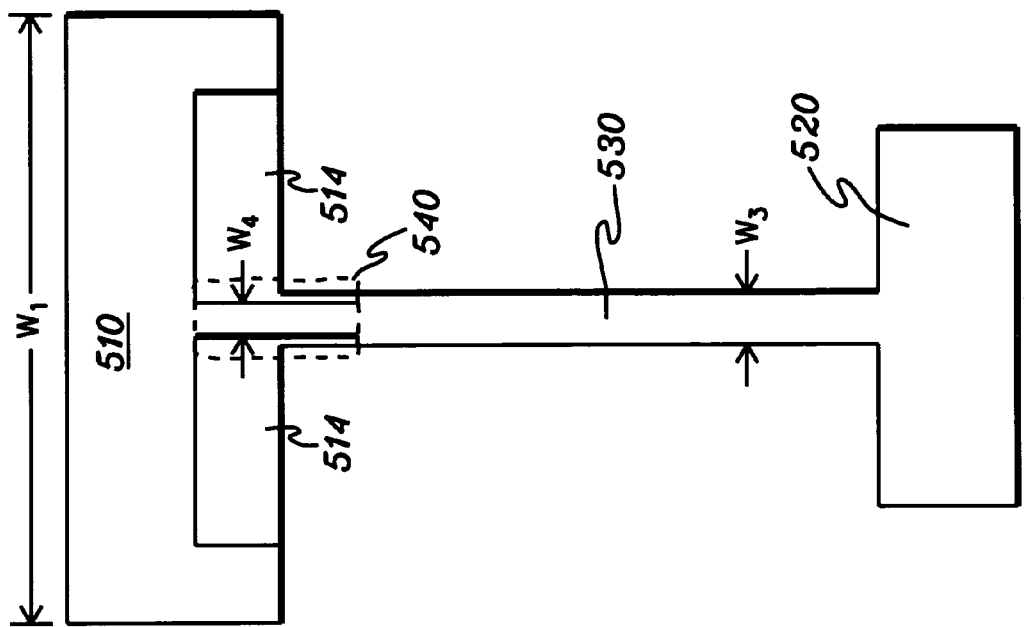
FIG. 5A is a plan view of one embodiment of a resultant fuse formed by siliciding the polysilicon support structure of FIG. 5, in accordance with an aspect of the present invention.
Figure 5:
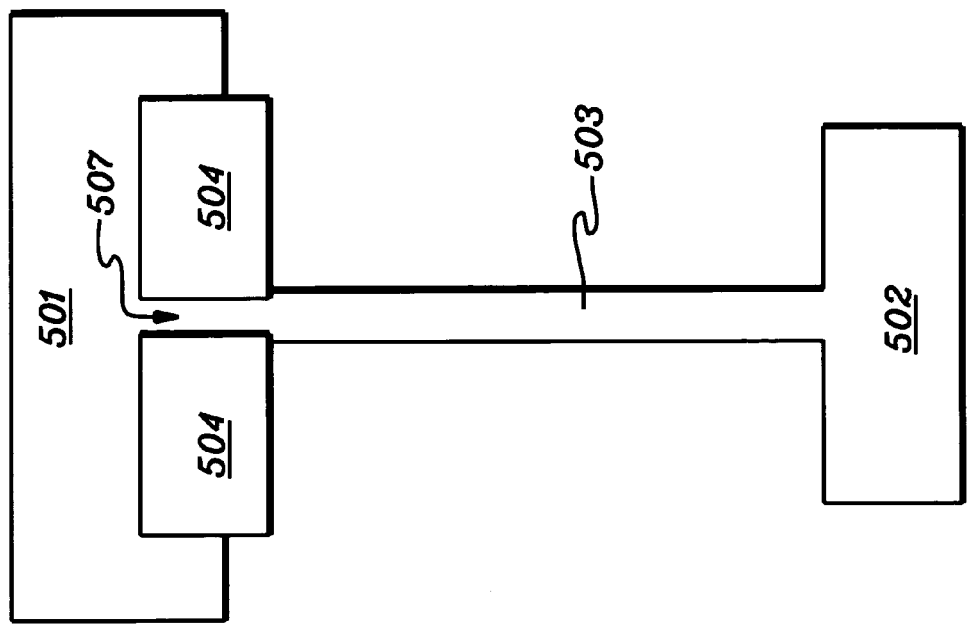
FIG. 5 is another plan view layout of a polysilicon support structure, and showing silicide blocking masks, to be employed in a fuse fabrication approach, in accordance with an aspect of the present invention.

FIGS. 5 & 5A depict an alternate fuse fabrication approach and fuse structure, in accordance with an aspect of the present invention.

In the FIG. 5 polysilicon support layout, the structure includes rectangular region 501 (sized and configured to underlie a first terminal portion of the fuse), region 502 (sized and configured to underlie a second terminal portion of the fuse), and an elongate third region 503 (sized and configured to underlie the elongate fuse element of the structure). Blocking masks 504 are employed in this approach over portions of polysilicon areas 501 & 503 at their interface to define a narrowed region of exposed polysilicon 507 between the blocking masks 504. Although shown defining an exposed polysilicon region having a width less than the width of region 503, it should be understood that blocking masks 504 could alternatively be spaced somewhat further apart than the width of polysilicon region 503, in which case, the blocking masks would only block portions of polysilicon region 501 underlying the first terminal portion to be formed. By way of specific example, the width of polysilicon region 507 may be less than or equal to two times the maximum width $W_3$ of the elongate fuse element to be formed (see FIG. 5A). In this fabrication approach, it is assumed that the underlying support region 503 has a same width as the silicided fuse element 530 to be formed thereon.

FIG. 5A illustrates one embodiment of the resultant fuse, wherein first terminal portion 510 and second terminal portion 520 are interconnected by fuse element 530. A narrowed width region 540 is shown disposed at the interface of first terminal portion 510 and fuse element 530. This fuse structure results from siliciding of the exposed polysilicon layout of FIG. 5. During metal deposition, blocking masks 504 block portions of underlying polysilicon structure 514, resulting in narrowed width region 540 in FIG. 5A comprising a portion of first terminal portion 510 and a portion of fuse element 530 as shown. The width $W_4$ of narrowed width region 540 in this example is less than the width $W_3$ of the fuse element 530, which is less than the maximum width $W_1$ of first terminal portion 510.

FIGS. 6 & 6A depict a further fabrication approach and fuse structure, in accordance with an aspect of the present invention.

In FIG. 6, a further plan view layout of a polysilicon support structure and blocking mask is provided. In this embodiment, the polysilicon support structure includes region 601 (sized and configured to underlie the first terminal portion), region 602 (sized and configured to underlie the second terminal portion), and region 603 (sized and configured to underlie the fuse element). Blocking masks 604 are again disposed in opposing relation at the interface of region 601 and region 603 leaving exposed a narrowed portion 607 of polysilicon. In this embodiment, the narrowed portion 607 includes part of underlying support structure 601 and part of underlying support structure 603, defining a layout configuration similar to that described above in connection with FIG. 5. As a further variation, however, an additional blocking mask 605 is provided overlying a portion of underlying support structure 603 in a region intermediate the first underlying support structure 601 and second underlying support structure 602. Blocking mask 605 covers a portion of polysilicon support structure 603 to define a reduced width region 608 of exposed polysilicon.

FIG. 6A depicts one embodiment of the resultant fuse structure obtained by siliciding the exposed polysilicon layout of FIG. 6. As shown, the structure includes a first terminal portion 610 and second terminal portion 620 interconnected by elongate fuse element 630. A narrowed width region 640 is defined at the interface between first terminal portion 610 and fuse element 630. This narrowed width region has a width $W_4$ that is narrower than the maximum fuse width $W_3$ of the fuse element. As shown, maximum width $W_3$ of the elongate fuse element is less than the maximum width $W_1$ of the first terminal portion 610. Regions of polysilicon 614 are left unsilicided in both the first terminal portion 610 and fuse element 630 at the interface between the structures. Again, as with the embodiment of FIGS. 5 & 5A, the width $W_4$ of the narrowed region 640 can be selected to equal the maximum width $W_3$ of the fuse element, or even a width somewhat larger than width $W_3$, but less than the maximum width $W_1$ of first terminal portion 610.

A restricted width region 650 is also defined in fuse element 630, resulting from the positioning of blocking mask 605 overlying a portion of underlying polysilicon support structure 603 (FIG. 6). After siliciding, the blocked portion of underlying polysilicon support structure 615 remains unsilicided, with metal having been deposited only in the restricted width region 650, resulting in the fuse element having a narrowed width $W_6$ in the restricted width region intermediate the first and second terminal portions. This restricted width region further confines and controls the electromigration of silicide within the fuse element. Narrowed width region 640 and restricted width region 650 result in separate engineered flux divergence paths being created within the fuse, with region 640 inhibiting electromigration of metal from the bulk of the first terminal portion, and region 650 facilitating occurrence electromigration within the fuse element intermediate the first and second terminal portions.

Figure 7A:
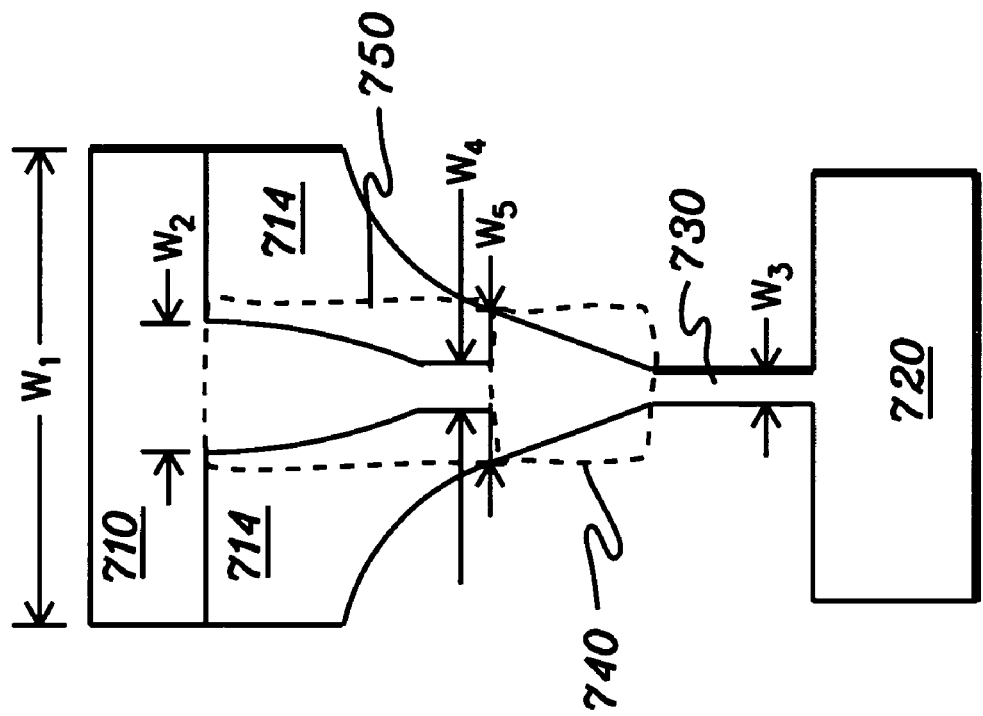
FIG. 7A is a plan view of one embodiment of a resultant fuse formed by siliciding the polysilicon support structure of FIG. 7, in accordance with an aspect of the present invention.
Figure 7:
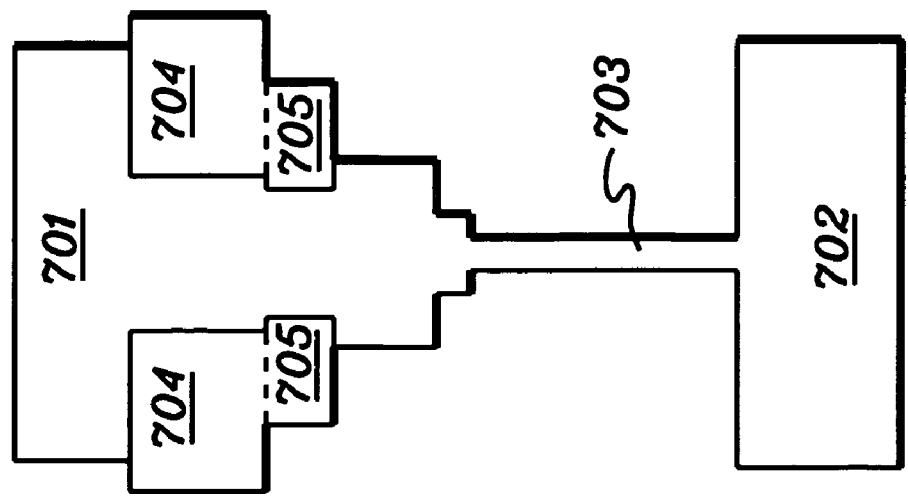
FIG. 7 is a further plan view layout of a polysilicon support structure, and blocking masks, to be employed in a fuse fabrication approach, in accordance with an aspect of the present invention.

FIGS. 7 & 7A depict a further fabrication approach and structure for controlling electromigration from the first terminal portion, in accordance with an aspect of the present invention.

FIG. 7 depicts a polysilicon support structure layout wherein multiple rectangular regions are used to define a first underlying support structure 701, a second underlying support structure 702 and a third underlying support structure 703 upon which the first terminal portion, second terminal portion and fuse element are to be subsequently formed (e.g., by siliciding exposed polysilicon as described above). First support structure 701 is stepped configured similar to support structure 401 illustrated in FIG. 4. However, in this embodiment, blocking masks 704 & 705 are employed along the sides of the structure to block subsequent silicide formation in those regions.

The resultant fuse is illustrated in FIG. 7A wherein first terminal portion 710 includes a narrowed width region comprising a first region of reduced width 740 and a second region of reduced width 750. The narrowed width region 740, 750 is disposed at the interface with fuse element 730 (which connects first terminal portion 710 and second terminal portion 720). As shown, first region 740 comprises a first tapered region wherein width of the first terminal portion tapers from a width $W_5$ to a width $W_3$, with width $W_3$ (in this embodiment) being the constant width of fuse element 730. Second region 750 also tapers from a wider region width $W_2$ to a narrower width $W_4$. In this embodiment, region 714 of polysilicon remains unsilicided due to the existence of blocking masks 704 & 705. The configuration of FIGS. 7 & 7A is one possible fabrication embodiment and resultant fuse structure wherein enhanced electromigration is provided in the fuse element, rather than the first terminal portion. Also, migration from the first terminal portion into the fuse element is mitigated by providing the relatively "cool" polysilicon areas 714 where there is relatively little current flow.

Figure 8A:
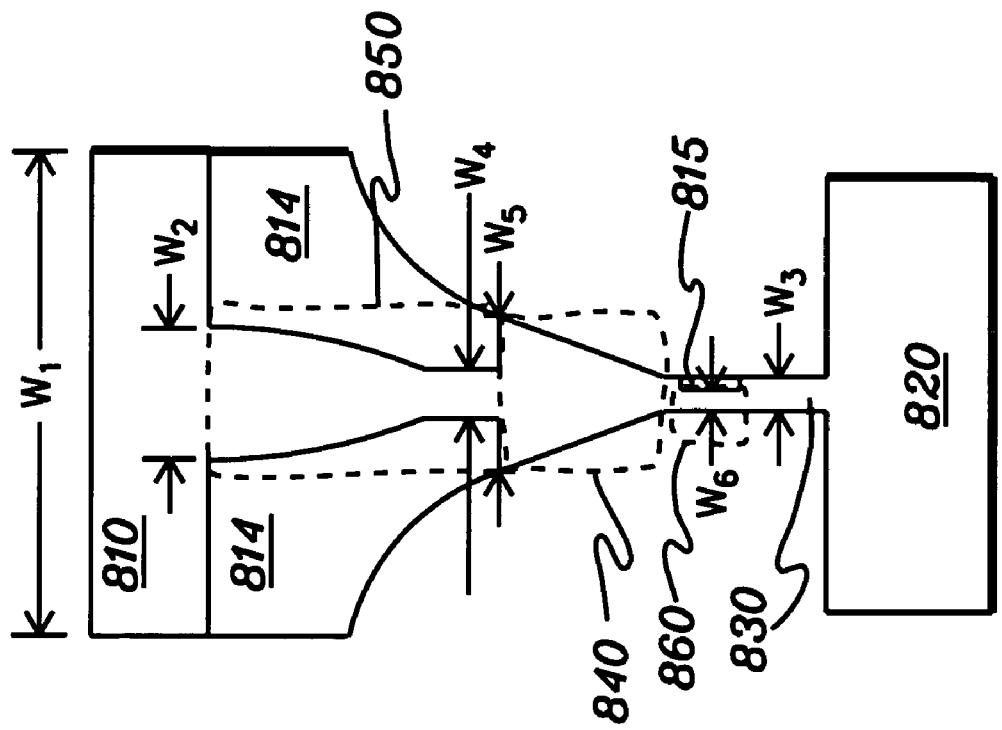
FIG. 8A is a plan view of one embodiment of a resultant fuse formed by siliciding the exposed polysilicon support structure of FIG. 8, in accordance with an aspect of the present invention.
Figure 8:
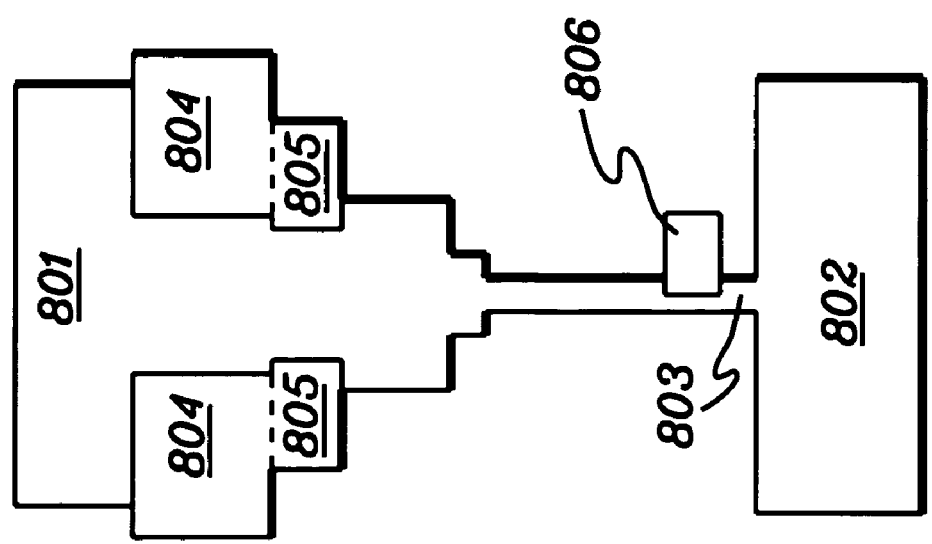
FIG. 8 is a still further plan view layout of a polysilicon support structure, and blocking masks defining multiple regions of exposed, reduced width polysilicon, to be employed in a fuse fabrication approach, in accordance with an aspect of the present invention.

FIGS. 8 & 8A depict a still further fabrication approach and structure for controlling electromigration from the first terminal portion of the fuse, in accordance with an aspect of the present invention.

FIG. 8 depicts a structure similar to that described above in connection of FIG. 7, but with the addition of a restricted width region within the fuse element. As shown, the underlying polysilicon support structure includes a first support structure 801 (to underlie the first terminal portion), a second support structure 802 (to underlie the second terminal portion), and a third support structure 803 (to underlie the fuse element). Blocking masks 804 & 805 are again disposed along the sides of the underlying support structure 801 for the first terminal portion. Further, a blocking mask 806 is disposed to overlie a portion of the width of support structure 803 in a location intermediate the support structures 801 & 802.

The resultant fuse structure is depicted in FIG. 8A, wherein a first terminal portion 810 and a second terminal portion 820 are connected by fuse element 830. First terminal portion 810 again includes a first region of reduced width 840 and a second region of reduced width 850, both of which are shown to have a tapered configuration. First region 840 tapers from a first width $W_5$ to a second width $W_3$, which in this embodiment is the width of the fuse element 830. Second region 850 tapers from a first width $W_2$ to a second width $W_4$. In this embodiment, areas of polysilicon 814 again remain unsilicided adjacent to the interface between first terminal portion 810 and fuse element 830 and are relatively "cool" regions of the fuse structure during programming of the fuse.

The restricted width region 860 within the fuse element has a width $W_6$ that is less than the maximum width $W_3$ of the elongate fuse element 830, with underlying polysilicon 815 of the support structure 803 remaining unsilicided. Regions 840, 850 & 860 facilitate control of the electromigration effects and thus programming of the fuse structure as described above.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An electrically programmable fuse for an integrated circuit, the fuse comprising:
   a first terminal portion and a second terminal portion interconnected by an elongate fuse element; and
   wherein the first terminal portion has a maximum width greater than a maximum width of the elongate fuse element and wherein the fuse includes a narrowed width region comprising part of the first terminal portion, and a width of the first terminal portion in the narrowed width region is less than the maximum width of the first terminal portion, thereby enhancing current crowding therein; and
   wherein the first terminal portion, the second terminal portion and the elongate fuse element comprise silicide disposed over a polysilicon support structure, the silicide having a planar configuration different from a planar configuration of the polysilicon support structure, and wherein the width of the first terminal portion in the narrowed width region is measured between a first side and a second side of the narrowed width region, the first side and the second side comprising opposing sides of the narrowed width region, and wherein the first side and the second side of the narrowed width region are bordered by unsilicided regions of the polysilicon support structure, the narrowed width region within the first terminal portion bordered by the unsilicided regions defining a non-uniform thermal gradient within the first terminal portion silicide with establishing of current between the first and second terminal portions through the elongate first element, the non-uniform thermal gradient within the first terminal portion inhibiting electromigration of silicide from the first terminal portion.

2. The fuse of claim 1, wherein the width of the narrowed width region varies.

3. The fuse of claim 2, wherein the narrowed width region comprises a tapered width region where width of the first terminal portion tapers from a first width less than or equal to the maximum width of the first terminal portion to a second width substantially equal to the maximum width of the elongate fuse element.

4. The fuse of claim 3, wherein the width of the elongate fuse element is one of a constant width equal to the maximum width thereof, or includes a restricted width region where width of the elongate fuse element is less than the maximum width of the elongate fuse element.

5. The fuse of claim 1, wherein the width of the first terminal portion in the narrowed width region is less than or equal to two times the maximum width of the elongate fuse element, and wherein width of the elongate fuse element is one of a constant width equal to the maximum width thereof, or includes a restricted width region where width of the elongate fuse element is less than the maximum width of the elongate fuse element.

6. The fuse of claim 1, wherein the narrowed width region extending at least partially into the first terminal portion has a width less than the maximum width of the elongate fuse element, and wherein the narrowed width region further extends partially into and comprises part of the elongate fuse element.

7. The fuse of claim 6, wherein the elongate fuse element further includes a restricted width region where width of the elongate fuse element is less than the maximum width of the elongate fuse element, the restricted width region being spaced from the narrowed width region, and being disposed intermediate the first terminal portion and the second terminal portion.

8. The fuse of claim 1, wherein the elongate fuse element further includes a restricted width region spaced from the narrowed width region, the restricted width region being disposed intermediate the first terminal portion and the second terminal portion, and a width of the elongate fuse element within the restricted width region being less than the maximum width of the elongate fuse element, and wherein the narrowed width region and the restricted width region are each configured to enhance electromigration when current is established through the fuse, thereby facilitating open circuiting of the fuse within the elongate fuse element.

9. The fuse of claim 1, wherein the narrowed width region at the interface of the first terminal portion and elongate fuse element comprises two regions of reduced width coupled in series extending into and comprising part of the first terminal portion, wherein at least one region of the two regions of reduced width is a tapered width region where width of the first terminal portion tapers from a first width less than or equal to the maximum width of the first terminal portion to a second width less than the first width.

* * * * *